(12) United States Patent
Peterson

(10) Patent No.: US 12,083,889 B2
(45) Date of Patent: Sep. 10, 2024

(54) VEHICULAR SENSING AND CONTROL SYSTEM FOR OVERHEAD CONSOLE

(71) Applicant: Magna Mirrors of America, Inc., Holland, MI (US)

(72) Inventor: Kenneth C. Peterson, Ada, MI (US)

(73) Assignee: Magna Mirrors of America, Inc., Holland, MI (US)

( * ) Notice: Subject to any disclaimer, the term of this patent is extended or adjusted under 35 U.S.C. 154(b) by 774 days.

(21) Appl. No.: 17/247,617

(22) Filed: Dec. 18, 2020

(65) Prior Publication Data

US 2021/0188092 A1 Jun. 24, 2021

Related U.S. Application Data

(60) Provisional application No. 62/952,777, filed on Dec. 23, 2019.

(51) Int. Cl.

| | |
|---|---|
| *B60K 35/10* | (2024.01) |
| *B60K 35/00* | (2024.01) |
| *B60K 35/25* | (2024.01) |
| *B60K 35/60* | (2024.01) |
| *H03K 17/955* | (2006.01) |
| *H03K 17/96* | (2006.01) |

(52) U.S. Cl.
CPC .............. *B60K 35/10* (2024.01); *B60K 35/00* (2013.01); *B60K 35/60* (2024.01); *H03K 17/955* (2013.01); *H03K 17/962* (2013.01); *H03K 17/964* (2013.01); *B60K 35/25* (2024.01); *B60K 2360/1446* (2024.01); *B60K 2360/332* (2024.01); *B60K 2360/336* (2024.01); *B60K 2360/771* (2024.01)

(58) Field of Classification Search
CPC ........ B60K 37/06; B60K 35/00; B60K 37/02; B60K 2370/1446; B60K 2370/771; B60K 2370/158; B60K 2370/336; B60K 2370/332; H03K 17/955; H03K 17/962; H03K 17/964

See application file for complete search history.

(56) References Cited

U.S. PATENT DOCUMENTS

| | | |
|---|---|---|
| 5,594,222 A | 1/1997 | Caldwell |
| 6,001,486 A | 12/1999 | Varaprasad et al. |
| 6,310,611 B1 | 10/2001 | Caldwell |

(Continued)

*Primary Examiner* — Anne Marie Antonucci
*Assistant Examiner* — Patrick M Brady
(74) *Attorney, Agent, or Firm* — HONIGMAN LLP

(57) ABSTRACT

A vehicular sensing and control system includes a sensor module having (i) a switch face, (ii) a force sensing sensor, (iii) a haptic feedback device, and (iv) a microcontroller. Responsive to a user applying a first finger force the switch face, a first signal generated by the force sensing sensor is provided to the microcontroller. The microcontroller, based on the first signal, causes the haptic feedback device to generate a first haptic feedback associated with a first function of the vehicle and controls the first function of the vehicle. Responsive to the driver applying a second finger force to the switch face, a second signal generated by the force sensing sensor is provided to the microcontroller. The microcontroller, based on the second signal, causes the haptic feedback device to generate a second haptic feedback associated with a second function of the vehicle and controls the second function of the vehicle.

20 Claims, 8 Drawing Sheets

(56) References Cited

U.S. PATENT DOCUMENTS

| | | |
|---|---|---|
| 6,320,282 B1 | 11/2001 | Caldwell |
| 6,369,804 B1 | 4/2002 | Sandbach |
| 6,437,258 B1 | 8/2002 | Sandbach |
| 6,452,479 B1 | 9/2002 | Sandbach |
| 6,492,980 B2 | 12/2002 | Sandbach |
| 6,501,465 B2 | 12/2002 | Sandbach |
| 6,504,531 B1 | 1/2003 | Sandbach |
| 6,627,918 B2 | 9/2003 | Getz et al. |
| 7,224,324 B2 | 5/2007 | Quist et al. |
| 7,249,860 B2 | 7/2007 | Kulas et al. |
| 7,253,723 B2 | 8/2007 | Lindahl et al. |
| 7,255,451 B2 | 8/2007 | McCabe et al. |
| 7,360,932 B2 | 4/2008 | Uken et al. |
| 7,446,924 B2 | 11/2008 | Schofield et al. |
| 8,890,955 B2 | 11/2014 | Peterson |
| 9,346,403 B2 | 5/2016 | Uken et al. |
| 9,598,016 B2 | 3/2017 | Blank et al. |
| 10,589,716 B2 | 3/2020 | Sobecki et al. |
| 10,864,846 B2 | 12/2020 | Peterson |
| 11,541,901 B2 * | 1/2023 | Rea ......... B60K 35/00 |
| 2006/0050018 A1 | 3/2006 | Hutzel et al. |
| 2008/0297475 A1 * | 12/2008 | Woolf ......... G06F 3/0234 |
| | | 345/173 |
| 2010/0250071 A1 * | 9/2010 | Pala ......... B60K 35/00 |
| | | 341/20 |
| 2013/0054048 A1 * | 2/2013 | Seymour ......... B60K 35/00 |
| | | 701/1 |
| 2014/0327653 A1 * | 11/2014 | Schneider ......... G06F 3/0444 |
| | | 345/173 |
| 2016/0091972 A1 * | 3/2016 | Patel ......... G06F 3/041 |
| | | 345/173 |
| 2019/0077311 A1 * | 3/2019 | Ali ......... B60R 13/02 |
| 2020/0387225 A1 * | 12/2020 | Das ......... G06F 3/0488 |
| 2021/0293061 A1 | 9/2021 | Blank et al. |
| 2021/0332619 A1 | 10/2021 | Peterson et al. |
| 2021/0365120 A1 * | 11/2021 | Ooi ......... G06F 3/0414 |

* cited by examiner

VEHICULAR SENSING AND CONTROL SYSTEM FOR OVERHEAD CONSOLE

CROSS REFERENCE TO RELATED APPLICATION

The present application claims the filing benefits of U.S. provisional application Ser. No. 62/952,777, filed Dec. 23, 2019, which is hereby incorporated herein by reference in its entirety.

FIELD OF THE INVENTION

The present invention relates generally to an accessory system for a vehicle and, more particularly, to an accessory system that utilizes one or more user actuatable inputs for controlling one or more functions of the accessory system.

BACKGROUND OF THE INVENTION

Use of switches or touch sensors are known to provide a user actuatable human machine interface in a vehicle, such as for controlling one or more devices or systems of the vehicle.

SUMMARY OF THE INVENTION

The present invention provides a vehicular sensing and control system for a vehicle including at least one sensor module for controlling at least one function of the vehicle. The sensor module is disposed in a cabin of a vehicle and accessible by a driver of the vehicle and includes (i) a switch face at an outer portion of the sensor module and accessible by the driver of the vehicle, (ii) a force sensing sensor disposed behind the switch face so as to sense force applied at the switch face, (iii) a haptic feedback device operable to provide haptic feedback at the switch face, and (iv) a printed circuit board comprising circuitry including a microcontroller. Responsive to the driver applying a first finger force to the switch face, a first signal generated by the force sensing sensor based on the first finger force applied to the switch face is provided to the microcontroller. Responsive to the microcontroller receiving the first signal, the microcontroller causes the haptic feedback device to generate a first haptic feedback associated with a first function of the vehicle, and the first haptic feedback includes a first predetermined feedback waveform. Responsive to the microcontroller receiving the first signal, the microcontroller also controls the first function of the vehicle (such as via generating an output that actuators or adjusts or controls the first function). Responsive to the driver applying a second finger force to the switch face that is different than the first finger force, a second signal generated by the force sensing sensor based on the second finger force applied to the switch face is provided to the microcontroller. Responsive to the microcontroller receiving the second signal, the microcontroller causes the haptic feedback device to generate a second haptic feedback signal associated with a second function of the vehicle that is different than the first function of the vehicle, and the second haptic feedback signal includes a second predetermined feedback waveform that is different than the first predetermined feedback waveform. Responsive to the microcontroller receiving the second signal, the microcontroller also controls the second function of the vehicle (such as via generating an output that actuators or adjusts or controls the first function).

These and other objects, advantages, purposes and features of the present invention will become apparent upon review of the following specification in conjunction with the drawings.

DESCRIPTION OF THE PREFERRED EMBODIMENTS

Figure 1:
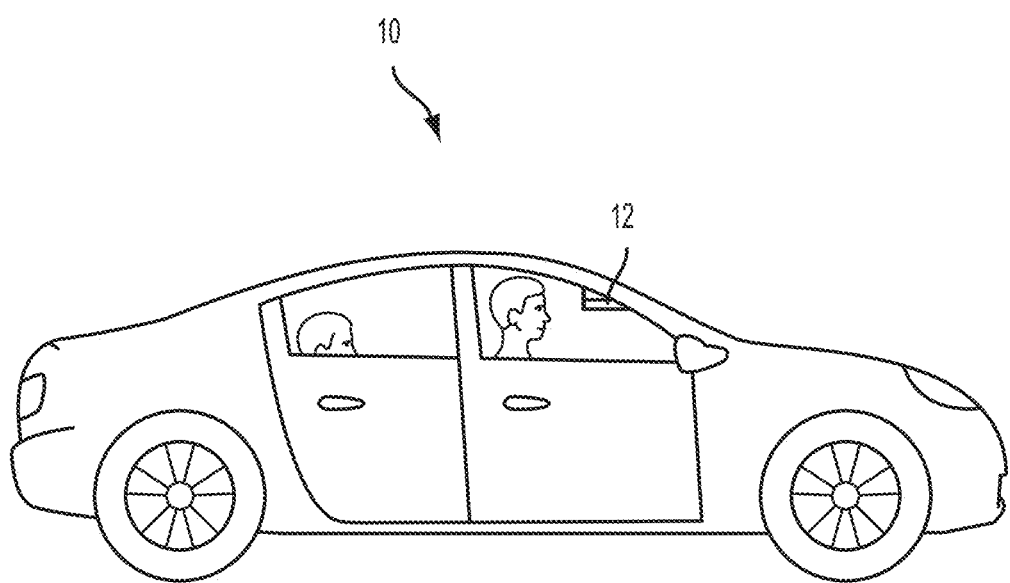
FIG. 1 is a plan view of a vehicle with a vehicular sensing and control system that includes one or more vehicular sensors in accordance with the present invention.
Figure 2:
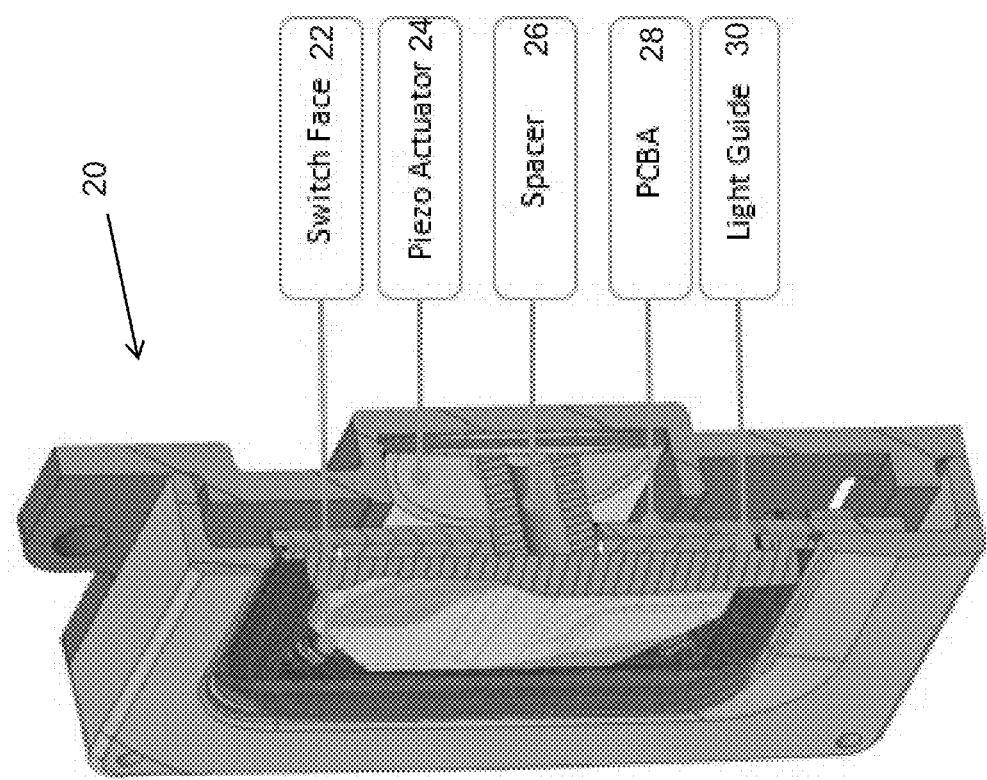
FIG. 2 is a sectional view of a vehicular sensor of the vehicular sensing and control system.

A vehicular proximity sensor or sensing and control system operates to control one or more features of a vehicle. Referring now to the drawings and the illustrative embodiments depicted therein, a vehicle 10 includes a vehicular sensing and control system 12 that includes at least one vehicular switch or sensor. Many automotive overhead consoles incorporate switches for controlling features such as interior lighting and/or the opening and closing of a sunroof or moonroof. These switches typically have a button face that the operator presses or slides to control the desired feature. These operating surfaces often actuate tactile switches or incorporate a capacitive sensor (usually for lighting).

Although capacitive touch switches are acceptable for some applications (e.g., lighting), with an overhead console application the user often is not looking at the console when they are using it, but rather locating an intended button by touch while directing their vision to the road while driving. This may result in inadvertent actuation of capacitive sensing switches if the driver touches one or more unintended switches while reaching without looking for the correct switch. It is therefore desirable to allow actuation by pressure in addition to touch.

Aspects of the present invention incorporate both capacitive sensing and force sensing in one package, along with a means of providing haptic feedback to the operator. This allows several functions to be incorporated into a single button or group of buttons.

Referring to FIGS. 2-7, a vehicular sensing and control system 12 of a vehicle 10 may determine which user input (e.g., a button) in a group of user inputs (FIG. 8) is being touched by a driver or passenger of the vehicle instead of signaling a touch event directly. A slight pressure on the button may activate the desired function (such as operating a light, operating a sunroof/moonroof, or opening a garage door, etc.), and the haptic feedback provides a tactile way for the user to know the desired function has been activated. This allows one force-sensing element and one haptic feedback element to be used for several switches (to provide control or adjustment of multiple accessories or systems, or multiple functions of an accessory or system), reducing cost and complexity.

In accordance with an aspect of the invention, a vehicular switch 20 of the vehicular sensing and control system 12 includes a piezoelectric actuator 24 ("Piezo Actuator") that provides both pressure sensing and haptic feedback. For example, the actuator 24 may be a TDK POWERHAP™ actuator. The piezoelectric actuator 24 may be controlled with a specialized IC such as a Boreas BOS1901. Pressure on a switch face 22, for example from a user pressing against the switch face 22, causes a force to be applied to a piezoelectric disk of the piezoelectric actuator 24 and generates a voltage that is detected using an integrated circuit (IC), such as a printed circuit board assembly 28 ("PCBA"). The printed circuit board assembly 28 may contain a microcontroller, a piezoelectric control IC, and/or capacitive sensor electrodes. The microcontroller may be a part of or in communication with an electronic control unit (ECU) of the vehicle and/or may include a microprocessor with circuitry and associated software, a digital signal processor (DSP), and the like. The microcontroller processes the voltage generated by the piezoelectric disk (or other pressure sensor). The switch face 22 is an outer surface of the switch 20 that is touched by the user. The switch face 22 may be transparent or translucent to accommodate backlit icons or other indicia. The sensor 20 may include a light guide 30 for applications with a backlit switch face 22 to provide uniform illumination of icons. The light guide 30 may be edge-lit via, for example, by one or more light emitting diodes (LED) mounted at the printed circuit board assembly 28.

Once the microcontroller/IC 28 determines that a threshold force is satisfied, for example by the user pressing hard enough on the switch face 22 causing the pressure sensor to generate a sufficient amount of voltage, the IC 28 drives the piezoelectric disk with a predetermined feedback waveform (e.g., haptic feedback) that the user can feel at the switch face 22. Several feedback profiles may be provided to indicate to the user a state of the switch 20. For example, a first pressure applied on the switch 20 may initiate a first function with a corresponding feedback signal, while additional or second pressure applied on the switch 20 may initiate a second function that is different than the first function with a different corresponding feedback signal. For example, the first pressure or force applied at the switch may cause the microcontroller to generate a first output for controlling a first function, such as tilting open a sunroof, while the second pressure or force applied at the switch may cause the microcontroller to generate a second output for controlling a second function, such as sliding open the sunroof.

In another example, pressure on the switch 20 may activate one function initially and then invoke an additional function with a corresponding haptic feedback signal after pressure has been applied to the switch 20 for a predetermined time interval such as, for example, more than two seconds or more than three seconds. In other words, a first function may be actuated in response to an initial pressure applied on the switch 20 by a user and a second function may be actuated in response to continued pressure applied on the switch 20 by a user. In yet another example, pressure for less than a threshold period (e.g., one second) may activate a first function while pressure for greater than the threshold period may activate a second function. For example, the pressure or force applied at the switch for the first period of time may cause the microcontroller to generate a first output for controlling a first function, such as tilting open a sunroof, while the pressure or force applied at the switch for the longer second period of time may cause the microcontroller to generate a second output for controlling a second function, such as sliding open the sunroof.

Optionally, the system may include capacitive sensors to determine finger position on the switch face 22. Several force sensing technologies may be used, such as force-sensing resistors (FSR) or load cells. As an alternative to a piezoelectric actuator 24 and corresponding high voltage drive circuit, other means of haptic feedback may be used such as an eccentric rotating mass actuator (ERM) or a linear resonant actuator (LRA). The capacitive sensors may work in conjunction with the pressure sensor(s). For example, the system may control different vehicle functions based on different amounts of pressure applied and/or for pressure applied for different threshold periods of time at a first location on the switch face 22 while the system may control different vehicle functions based on different amounts of pressure applied and/or pressure applied for different threshold periods of time at a second location on the switch face 22. The system may include any number of regions or respective areas to detect finger position. For example, the system may include three different regions that the system may detect a finger, and each region may be dedicated to controlling at least one different vehicle function. Each function may be associated with a different feedback profile (i.e., predetermined feedback waveform). For example, one location may provide control of the sunroof (tilt open, slide open, close etc.), while another location may provide interior light control or the like.

Optionally, the switch 20 may include a spacer 26 that transmits force from the user pressing the switch face 22 to the piezoelectric actuator 24. The spacer may also transmit haptic feedback vibrations from the actuator 24 to the switch face 22. The actuator 24 is spaced a distance from the switch face 22 to avoid interference with capacitive sensors.

Figure 3:
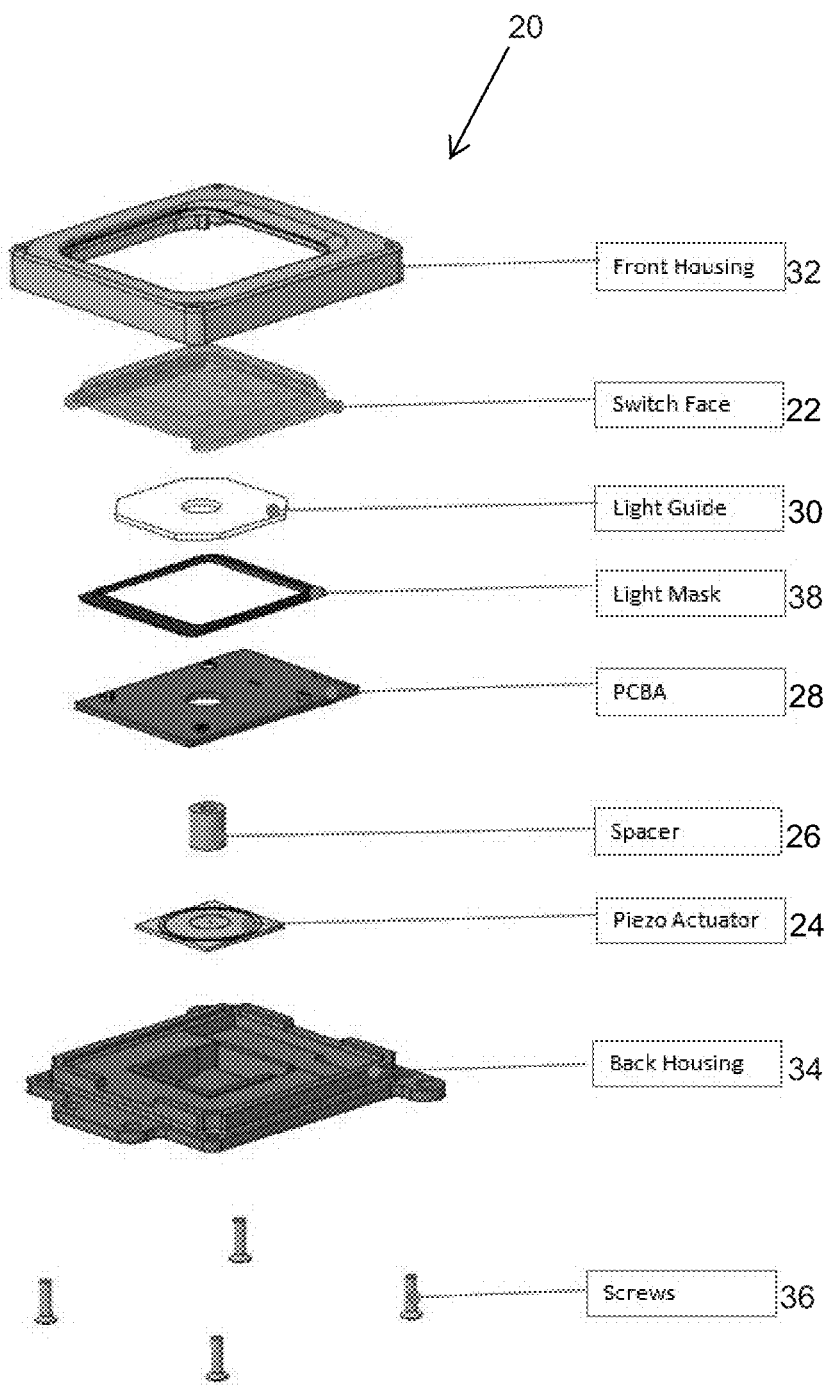
FIG. 3 is an exploded view of the vehicular sensor.
Figure 4:
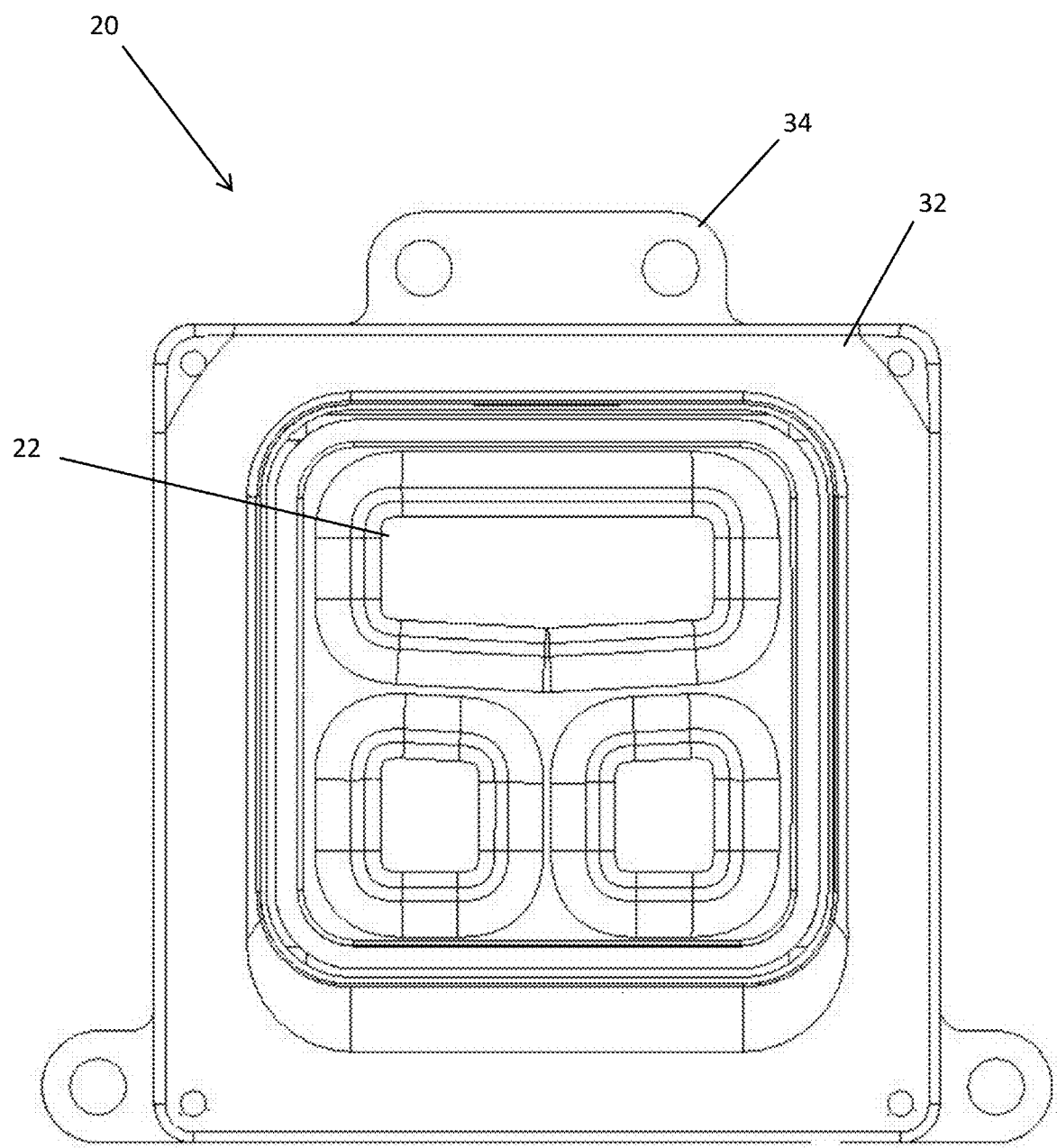
FIG. 4 is a plan view of the vehicular sensor.
Figure 5:
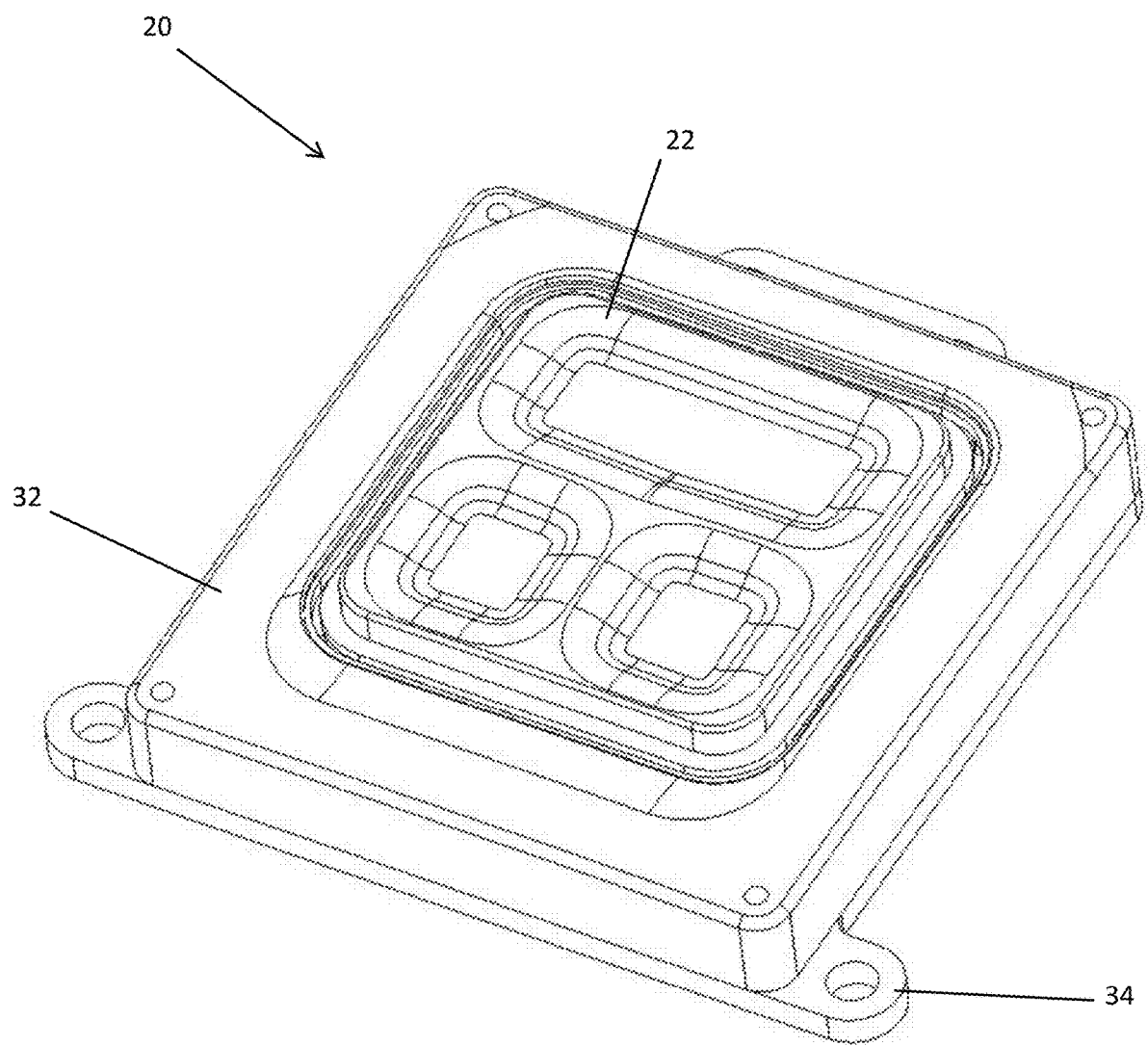
FIG. 5 is a perspective view of the vehicular sensor.
Figure 6:
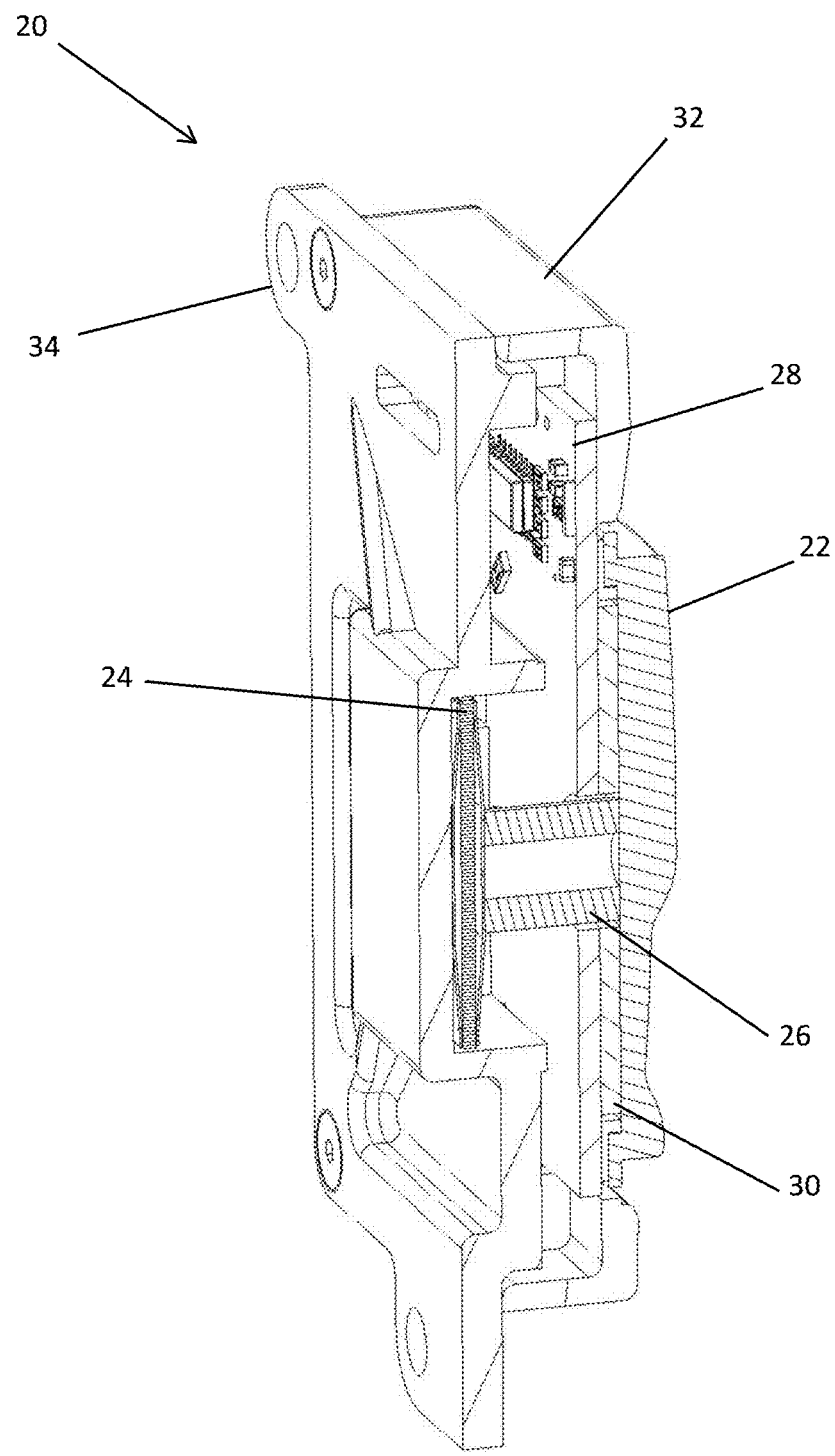
FIG. 6 is another sectional view of the vehicular sensor.
Figure 7:
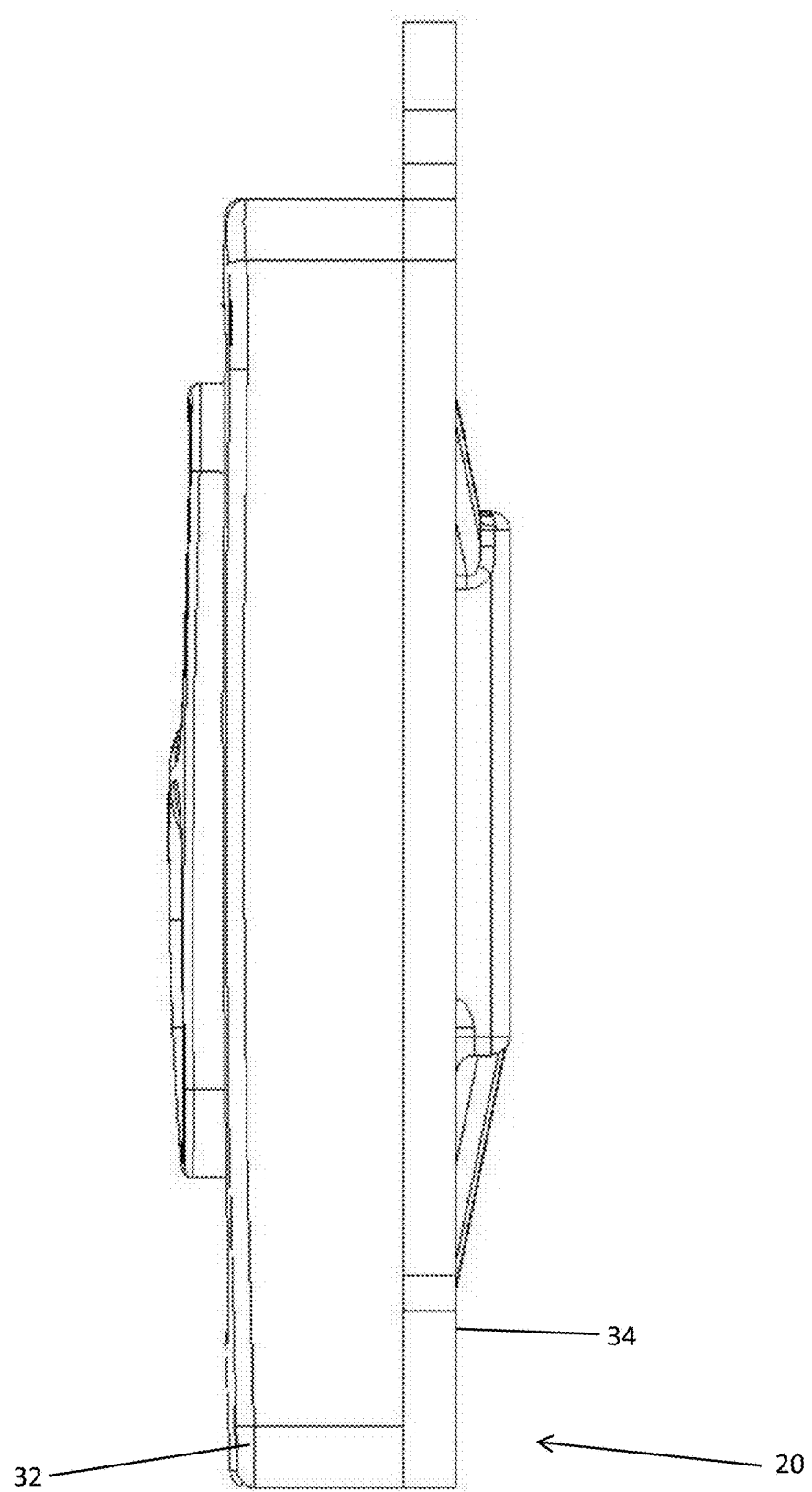
FIG. 7 is another plan view of the vehicular sensor.

Referring now to FIG. 3, the switch 20 may include a front housing 32 and a rear housing 34 to enclose the components of the switch 20. The front housing 32 may be secured to the rear housing via, for example, screws 36 and/or adhesive or the like. The switch 20 may include a light mask 38 to mask light emitted by the light guide 30.

Figure 9:
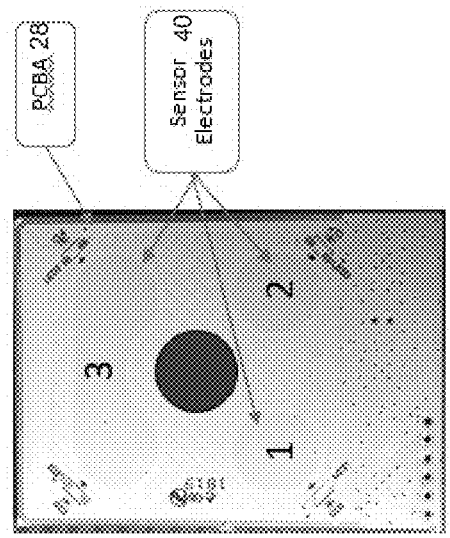
FIG. 9 is a plan view of a printed circuit board assembly with three sensor electrodes.
Figure 10:
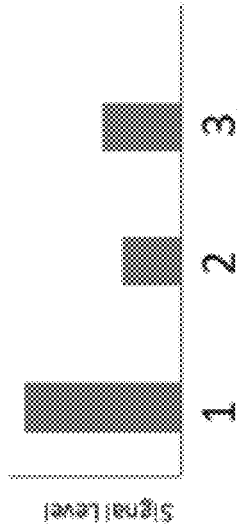
FIG. 10 is a graph of signal levels of the three sensor electrodes 40 of FIG. 9.
Figure 8:
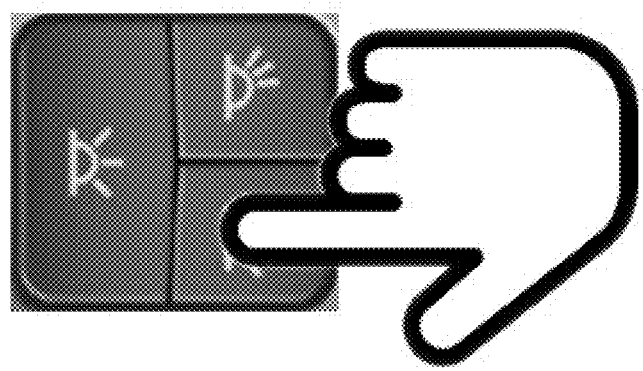
FIG. 8 is a plan view of a vehicular sensor with three buttons.

Referring now to FIGS. 8-10, the switch 20 may determine finger position using a capacitive and/or proximity sensing mode. For example, the switch 20 may include three separate buttons (FIG. 8). When pressure on the switch face 22 is registered, finger position may be determined by the strongest capacitive signal, which may be measured by sensor electrodes 40 disposed at printed circuit board assembly 28 (FIG. 9). FIG. 10 illustrates exemplary capacitive signals measured at three different sensor electrodes 40. In this example, the switch 20 may determine the finger position is over the sensor electrode '1' because the sensor electrode 40 corresponding to position '1' registered the strongest capacitive signal among the three sensor electrodes 40.

The switch may utilize aspects of touch sensitive elements or touch sensors or proximity sensors, such as touch sensitive elements of the types described in U.S. Pat. Nos. 5,594,222; 6,001,486; 6,310,611; 6,320,282; 6,627,918; 7,224,324; 7,253,723; 9,346,403 and/or 9,598,016, which are hereby incorporated herein by reference in their entireties, or such as proximity sensors of the types described in U.S. Pat. Nos. 7,224,324; 7,249,860 and/or 7,446,924, and/or U.S. Publication No. US-2006-0050018, which are hereby incorporated herein by reference in their entireties, or such as membrane type switches, such as described in U.S.

Pat. No. 7,360,932, which is hereby incorporated herein by reference in its entirety, or such as detectors and the like of the types disclosed in U.S. Pat. Nos. 7,255,541; 6,504,531; 6,501,465; 6,492,980; 6,452,479; 6,437,258 and/or 6,369,804, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular sensing and control system, the vehicular sensing and control system comprising:
   a sensor module disposed in a cabin of a vehicle and accessible by a driver of the vehicle, the sensor module comprising (i) a switch face at an outer portion of the sensor module and accessible by the driver of the vehicle, (ii) a force sensing sensor disposed behind the switch face so as to sense force applied at the switch face, (iii) a haptic feedback device operable to provide haptic feedback at the switch face, and (iv) a printed circuit board comprising circuitry including a microcontroller;
   wherein the sensor module comprises a spacer, and wherein the spacer maintains a threshold amount of distance between the switch face and the force sensing sensor when force is applied to the switch face, and wherein the spacer transmits force applied to the switch face to the force sensing sensor;
   wherein, responsive to the driver applying a first finger force to the switch face, a first signal generated by the force sensing sensor based on the first finger force applied to the switch face is provided to the microcontroller;
   wherein, responsive to the microcontroller receiving the first signal, the microcontroller causes the haptic feedback device to generate a first haptic feedback associated with a first function of the vehicle, and wherein the first haptic feedback comprises a first predetermined feedback waveform;
   wherein, responsive to the microcontroller receiving the first signal, the microcontroller controls the first function of the vehicle;
   wherein, responsive to the driver applying a second finger force to the switch face that is different than the first finger force, a second signal generated by the force sensing sensor based on the second finger force applied to the switch face is provided to the microcontroller;
   wherein, responsive to the microcontroller receiving the second signal, the microcontroller causes the haptic feedback device to generate a second haptic feedback signal associated with a second function of the vehicle that is different than the first function of the vehicle, and wherein the second haptic feedback signal comprises a second predetermined feedback waveform that is different than the first predetermined feedback waveform; and
   wherein, responsive to the microcontroller receiving the second signal, the microcontroller controls the second function of the vehicle.

2. The vehicular sensing and control system of claim 1, wherein the force sensing sensor and the haptic feedback device comprise a piezoelectric actuator.

3. The vehicular sensing and control system of claim 1, wherein the sensor module comprises a light guide, and wherein the switch face is transparent, and wherein the light guide provides uniform illumination of icons visible through the transparent switch face.

4. The vehicular sensing and control system of claim 3, wherein the light guide is edge-lit by at least one light emitting diode.

5. The vehicular sensing and control system of claim 1, wherein, responsive to the driver applying the second finger force to the switch face for a threshold period of time, the force sensing sensor generates the second signal.

6. The vehicular sensing and control system of claim 1, wherein the force sensing sensor comprises a force sensing resistor.

7. The vehicular sensing and control system of claim 1, wherein the haptic feedback device comprises one selected from the group consisting of an eccentric rotating mass actuator and a linear resonant actuator.

8. The vehicular sensing and control system of claim 1, wherein the spacer provides a threshold amount of distance between the switch face and the haptic feedback device, and wherein the threshold amount of distance reduces interference between at least one capacitive touch sensor and the haptic feedback device.

9. The vehicular sensing and control system of claim 8, wherein the at least one capacitive touch sensor comprises at least one sensor electrode that generates a capacitive signal based on a proximity of the finger of the driver.

10. The vehicular sensing and control system of claim 1, wherein the first function of the vehicle comprises enabling or disabling an interior light.

11. The vehicular sensing and control system of claim 1, wherein the first function of the vehicle comprises controlling a sunroof of the vehicle.

12. The vehicular sensing and control system of claim 1, wherein the sensor module is disposed at an overhead portion of the cabin of the vehicle.

13. A vehicular sensing and control system, the vehicular sensing and control system comprising:
   a sensor module disposed in a cabin of a vehicle and accessible by a driver of the vehicle, the sensor module comprising (i) a switch face at an outer portion of the sensor module and accessible by the driver of the vehicle, (ii) a force sensing sensor disposed behind the switch face so as to sense force applied at the switch face, (iii) a haptic feedback device operable to provide haptic feedback at the switch face, and (iv) a printed circuit board comprising circuitry including a microcontroller;
   wherein the sensor module comprises a spacer, and wherein the spacer maintains a threshold amount of distance between the switch face and the force sensing sensor when force is applied to the switch face, and wherein the spacer transmits force applied to the switch face to the force sensing sensor;
   wherein, responsive to the driver applying finger force to the switch face for a first threshold period of time, a first signal generated by the force sensing sensor based on the finger force applied to the switch face is provided to the microcontroller;
   wherein, responsive to the microcontroller receiving the first signal, the microcontroller causes the haptic feedback device to generate a first haptic feedback associated with a first function of the vehicle, and wherein the first haptic feedback comprises a first predetermined feedback waveform;

wherein, responsive to the microcontroller receiving the first signal, the microcontroller controls the first function of the vehicle;

wherein, responsive to the driver applying the finger force to the switch face for a second threshold period of time different than the first threshold period of time, a second signal generated by the force sensing sensor based on the finger force applied to the switch face is provided to the microcontroller;

wherein, responsive to the microcontroller receiving the second signal, the microcontroller causes the haptic feedback device to generate a second haptic feedback signal associated with a second function of the vehicle that is different than the first function of the vehicle, and wherein the second haptic feedback signal comprises a second predetermined feedback waveform that is different than the first predetermined feedback waveform; and wherein, responsive to the microcontroller receiving the second signal, the microcontroller controls the second function of the vehicle.

14. The vehicular sensing and control system of claim 13, wherein the force sensing sensor and the haptic feedback device comprise a piezoelectric actuator.

15. The vehicular sensing and control system of claim 13, wherein the sensor module comprises a light guide, and wherein the switch face is transparent, and wherein the light guide provides uniform illumination of icons visible through the transparent switch face.

16. The vehicular sensing and control system of claim 15, wherein the light guide is edge-lit by at least one light emitting diode.

17. A vehicular sensing and control system, the vehicular sensing and control system comprising:

a sensor module disposed in a cabin of a vehicle and accessible by a driver of the vehicle, the sensor module comprising (i) a switch face at an outer portion of the sensor module and accessible by the driver of the vehicle, (ii) a force sensing sensor disposed behind the switch face so as to sense force applied at the switch face, (iii) at least one capacitive touch sensor disposed at the switch face, (iv) a haptic feedback device operable to provide haptic feedback at the switch face, and (v) a printed circuit board comprising circuitry including a microcontroller;

wherein the sensor module comprises a spacer, and wherein the spacer maintains a threshold amount of distance between the switch face and the force sensing sensor when force is applied to the switch face, and wherein the spacer transmits force applied to the switch face to the force sensing sensor;

wherein, responsive to the driver applying a first finger force to the switch face, the microcontroller determines a first position of the finger on the switch face via the at least one capacitive touch sensor;

wherein, responsive to determining the first position of the finger on the switch face, the microcontroller causes the haptic feedback device to generate a first haptic feedback associated with a first function of the vehicle, and wherein the first haptic feedback comprises a first predetermined feedback waveform;

wherein, responsive to determining the first position of the finger on the switch face, the microcontroller controls the first function of the vehicle;

wherein, responsive to the driver applying a second finger force, the microcontroller via the at least one capacitive touch sensor determines a second position of the finger on the switch face that is different than the first position;

wherein, responsive to determining the second position of the finger on the switch face, the microcontroller causes the haptic feedback device to generate a second haptic feedback signal associated with a second function of the vehicle that is different than the first function of the vehicle, and wherein the second haptic feedback signal comprises a second predetermined feedback waveform that is different than the first predetermined feedback waveform; and wherein, responsive to determining the second position of the finger on the switch face, the microcontroller controls the second function of the vehicle.

18. The vehicular sensing and control system of claim 17, wherein the force sensing sensor comprises a force sensing resistor.

19. The vehicular sensing and control system of claim 17, wherein the haptic feedback device comprises one selected from the group consisting of an eccentric rotating mass actuator and a linear resonant actuator.

20. The vehicular sensing and control system of claim 17, wherein the sensor module is disposed at an overhead portion of the cabin of the vehicle.

* * * * *